United States Patent [19]
Hause et al.

[11] Patent Number: 5,933,721
[45] Date of Patent: Aug. 3, 1999

[54] METHOD FOR FABRICATING DIFFERENTIAL THRESHOLD VOLTAGE TRANSISTOR PAIR

[75] Inventors: Frederick N. Hause, Austin; Mark I. Gardner, Cedar Creek; Daniel Kadosh, Austin, all of Tex.

[73] Assignee: Advanced Micro Devices, Inc., Sunnyvale, Calif.

[21] Appl. No.: 08/837,580

[22] Filed: Apr. 21, 1997

[51] Int. Cl.$^6$ .................................................. H01L 21/60
[52] U.S. Cl. .......................... 438/217; 438/217; 438/548; 438/549; 438/558; 438/564; 438/223; 438/227; 438/231; 438/232
[58] Field of Search .................................... 438/217, 548, 438/549, 558, 564, 223, 227, 231, 232

[56] References Cited

U.S. PATENT DOCUMENTS

| | | | |
|---|---|---|---|
| 5,407,839 | 4/1995 | Maruo | 438/217 |
| 5,422,301 | 6/1995 | Otsuki | 438/227 |
| 5,516,707 | 5/1996 | Loh et al. | 438/302 |
| 5,770,490 | 6/1998 | Frenette et al. | 438/548 |

OTHER PUBLICATIONS

A.B. Joshi et al., "Oxynitride Gate Dielectrics for p$^+$–Polysilicon Gate MOS Devices," *IEEE Electron Devices Letters*, vol. 14, No. 12, pp.560–562 (Dec. 1993).

H. Fang et al., "Low–Temperature Furnace–Grown Reoxidized Nitrided Oxide Gate Dielectrics as a Barrier to Boron Penetration," *IEEE Electron Device Letters*, vol. 13, No. 4, pp. 217–219 (Apr., 1992).

Hattangady et al., "Controlled Nitrogen Incorporation at the Gate Oxide Surface," *Applied Physics Letters*, vol. 66, No. 25, pp. 3495–3497 (Jun. 19, 1995).

Silicon Processing for the VLSI Era—vol.1: Process Technology, by S. Wolf, published by Lattice Press, Sunset Beach, CA, 1986, pp. 182–195, 209–211, 280–283, 294, 308, 321–327.

Silicon Processing for the VLSI Era—vol.2: Process Integration, by S. Wolf, published by Lattice Press, Sunset Beach, CA, 1990, pp. 124–131.

T. Kuroi et al., "Novel NICE (Nitrogen Implantation into CMOS Gate Electrode and Source–Drain) Structure for High Reliability and High Performance 0.25 μm Dual Gate CMOS," International Electron Devices Meeting 1993, pp. 325–328 (Dec. 5–8, 1993—Washington, DC).

C.T. Liu et al., "25Å Gate Oxide without Boron Penetration for 0.25 and 0.3–μm PMOSFETs," 1996 Symposium on VLSI Technology—Digest of Technical Papers, pp. 18–19.

(List continued on next page.)

*Primary Examiner*—Trung Dang
*Attorney, Agent, or Firm*—Skjerven, Morrill, MacPherson, Franklin & Friel LLP

[57] ABSTRACT

A method of establishing a differential threshold voltage during the fabrication of first and second IGFETs having like conductivity type is disclosed. A dopant is introduced into the gate electrode of each transistor of the pair. The dopant is differentially diffused into respective channel regions to provide a differential dopant concentration therebetween, which results in a differential threshold voltage between the two transistors. One embodiment includes introducing a diffusion-retarding material, such as nitrogen, into the first gate electrode before the dopant is diffused into the respective channel regions, and without introducing a significant amount of the diffusion-retarding material into the second gate electrode. Advantageously, a single dopant implant can provide both threshold voltage values. The two threshold voltages may be chosen to provide various combinations of enhancement mode and depletion mode IGFETs.

31 Claims, 3 Drawing Sheets

OTHER PUBLICATIONS

C.T. Liu et al., "High Performance 0.2 μm CMOS with 25Å Gate Oxide Grown on Nitrogen Implanted Si Substrates," International Electron Devices Meeting 1996, pp. 499–502 (Dec. 8–11, 1996—San Francisco, CA).

H. Sayama et al., "Low Voltage Operation of Sub–Quarter Micron W–Polycide Dual Gate CMOS with Non–Uniformly Doped Channel," International Electron Devices Meeting 1996, pp. 583–586 (Dec. 8–11, 1996)—San Francisco, CA).

S. Shimizu et al., "Impact of Surface Proximity Gettering and Nitrided Oxide Side–Wall Spacer by Nitrogen Implantation on Sub–Quarter Micron CMOS LDD FETs," International Electron Devices Meeting 1995, pp. 859–862, (Dec. 10–13, 1995—Washington, DC).

METHOD FOR FABRICATING DIFFERENTIAL THRESHOLD VOLTAGE TRANSISTOR PAIR

BACKGROUND OF THE INVENTION

1. Field of the Invention

The present invention relates to integrated circuit manufacturing, and more particularly to insulated-gate field-effect transistors.

2. Description of Related Art

An insulated-gate field-effect transistor (IGFET), such as a metal-oxide semiconductor field-effect transistor (MOSFET), uses a gate electrode to control an underlying surface channel joining a source and a drain. The channel, drain and source are located in a semiconductor substrate, with the channel being doped oppositely to the drain and source. The gate electrode is separated from the semiconductor substrate by a thin insulating layer (i.e., a gate dielectric layer) such as an oxide. The operation of the IGFET involves application of an input voltage to the gate electrode, which sets up a transverse electric field in the channel in order to modulate the longitudinal conductance of the channel.

Polysilicon (also called polycrystalline silicon, poly-Si or just "poly") thin films have many important uses in IGFET technology. One of the key innovations is the use of heavily doped polysilicon in place of aluminum as the gate electrode. Since polysilicon has the same high melting point as a silicon substrate, typically a blanket polysilicon layer is deposited prior to source and drain formation, and the polysilicon is anisotropically etched to provide the gate electrode. Thereafter, the gate electrode provides an implant mask during the implantation of source and drain regions, and the implanted dopants are driven-in and activated using a high-temperature anneal that would otherwise melt the aluminum. Photolithography is used to create patterns in the photoresist mask that define the gate electrode.

An important parameter in IGFETs is the threshold voltage ($V_T$), which is the minimum gate voltage required to induce the channel. In general, the positive gate voltage of an N-channel device must be larger than some threshold voltage before a conducting channel is induced, and the negative gate voltage of a P-channel device must be more negative than some threshold voltage to induce the required positive charge (mobile holes) in the channel. There are, however, exceptions to this general rule. For example, depletion-mode devices already have a channel with zero gate voltage, and therefore are normally on. With N-channel depletion-mode devices a negative gate voltage is required to turn the devices off, and with P-channel depletion-mode devices a positive gate voltage is required to turn the devices off.

If the source and body of an IGFET are tied to ground, the threshold voltage can be calculated as follows:

$$V_T = \phi_{ms} - 2\phi_f - Q_{tot}/C_{ox} - Q_{BO}/C_{ox} - \Delta V_T \quad (1)$$

where $\phi_{ms}$ is the work-function difference between the gate material and the bulk silicon in the channel, $\phi_f$ is the equilibrium electrostatic potential in a semiconductor, $Q_{tot}$ is the total positive oxide charge per unit area at the interface between the oxide and the bulk silicon, $C_{ox}$ is the gate oxide capacitance per unit area, $Q_{BO}$ is the charge stored per unit area in the depletion region, and $\Delta V_T$ is a threshold lowering term associated with short-channel effects. Expressions have been established for these various quantities in terms of doping concentrations, physical constants, device structure dimensions, and temperature. For example, the total positive charge $Q_{tot}$ varies as a function of the dopant concentration in the channel region. Therefore, the threshold voltage depends on the doping concentration in the channel region.

The gate electrode is typically doped by the same ion implantation as are the source and drain. For example, boron is frequently implanted to form the source and drain in a P-channel IGFET, and the boron is also implanted into the gate electrode of the IGFET to create a P-type polysilicon gate electrode. However, because boron is such a "light" atom (i.e., low atomic mass), boron implanted into the polysilicon gate electrode can easily diffuse downward along the grain boundaries of the polysilicon and into the gate oxide, and may diffuse ultimately into the underlying channel region. Such additional boron diffused from the gate electrode into the channel affects the device parameters of the IGFET, especially the threshold voltage.

Considerable effort has been expended in the industry in an attempt to minimize such dopant diffusion from a gate electrode into an underlying channel region. One such method is disclosed by Fang, et al, in a paper entitled "Low-Temperature Furnace-Grown Reoxidized Nitrided Oxide Gate Dielectrics as a Barrier to Boron Penetration," *IEEE Electron Device Letters*, Vol. 13, No. 4, Apr. 1992, which includes a nitridation of a partially grown gate oxide, followed by an additional oxidation step. Polysilicon is then deposited on the reoxidized nitrided oxide and etched to form gate electrodes. Other similar methods are disclosed by Joshi, et al in a paper entitled "Oxynitride Gate Dielectrics for P+-polysilicon Gate MOS Devices," *IEEE Electron Device Letters*, Vol. 14, No. 12, Dec. 1993, which compares several similar methods of forming oxynitride gate dielectrics. These and other methods are directed to minimizing or eliminating what is viewed as a unwanted effect.

Ion implantation is frequently used to alter the threshold voltage of an IGFET by adjusting the total positive oxide charge, $Q_{tot}$, per unit area at the interface between the oxide and the bulk silicon. Selective ion implantation is also frequently performed to achieve multiple kinds of IGFETs having different threshold voltages. In the usual practice a separate mask is required to isolate the IGFETs to receive the selective threshold-setting ion implantation, as well as a separate ion implantation itself, for each different threshold voltage.

SUMMARY OF THE INVENTION

It is an object of the present invention to provide for a differential threshold voltage in an IGFET transistor pair. A dopant is introduced into the gate electrode for both the first transistor and the second transistor of the pair. The dopant is differentially diffused into the respective channel regions to provide a differential dopant concentration therebetween, which results in a differential threshold voltage between the two transistors. Advantageously, a single dopant implant can provide both threshold voltage values. The two threshold voltages may be chosen to provide any combination of enhancement mode and depletion mode IGFETs.

In accordance with one aspect of the invention, a method of establishing a differential threshold voltage during the fabrication of first and second IGFETs having like conductivity type includes providing a semiconductor substrate with first and second channel regions disposed within respective first and second active regions of like conductivity type, and first and second portions of a gate electrode layer respectively formed over the first and second channel regions, introducing a dopant into the first and second portions of the gate electrode layer, diffusing a first amount of the dopant from the first portion of the gate electrode layer into the first channel region, diffusing a second amount of dopant from the second portion of the gate electrode layer into the second channel region, and removing portions of the gate electrode layer other than the first and second portions to form respective first and second gate electrodes for the respective first and second IGFETs, wherein the first amount differs from the second amount, thereby establishing a differential dopant concentration between the first and second channel regions to provide a differential threshold voltage between the first and second IGFETs.

In one embodiment, the invention includes introducing a diffusion-retarding material into the first portion of the gate electrode layer over the first channel region before the first amount of dopant is diffused into the first channel region, and without introducing a significant amount of the diffusion-retarding material into the second portion of the gate electrode layer over the second channel region. Preferably, the first and second amounts of dopant are diffused into the respective first and second channel regions during a single operation, the respective gate electrodes are formed before introducing the dopant thereinto, the diffusion-retarding material contains nitrogen, and the first amount is substantially zero.

These and other objects, features and advantages of the invention will be further described and more readily apparent from a review of the detailed description of the preferred embodiments which follows.

BRIEF DESCRIPTION OF THE DRAWINGS

The present invention may be better understood, and its numerous objects, features, and advantages made apparent to those skilled in the art by referencing the accompanying drawings.

In the drawings, depicted elements are not necessarily drawn to scale and like or similar elements may be designated by the same reference numeral throughout the several views.

DESCRIPTION OF THE PREFERRED EMBODIMENTS

Figure 1A:
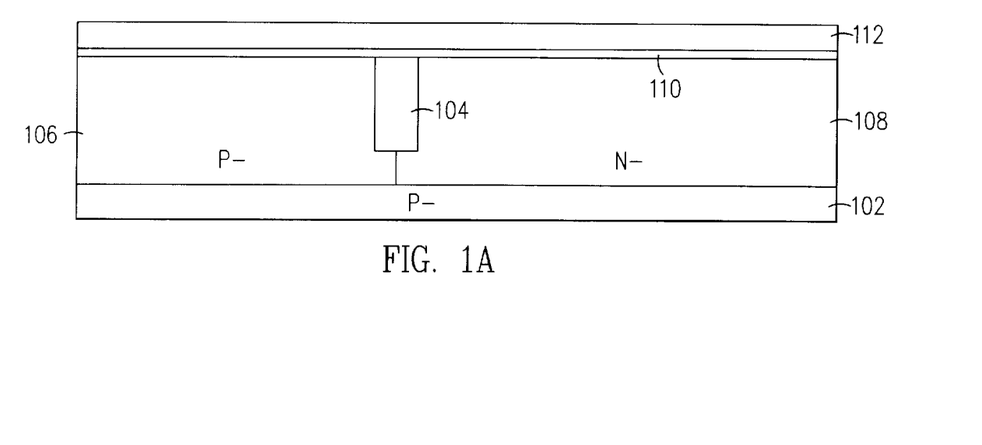
FIGS. 1A–1H show cross-sectional views of successive process steps for making both N-channel (i.e., NMOS) and P-channel (i.e., PMOS) transistors, including a pair of P-channel IGFETs with differential threshold voltages in accordance with an embodiment of the invention.

In FIG. 1A, silicon substrate 102 suitable for integrated circuit manufacture is provided. Substrate 102 includes a P– type epitaxial surface layer disposed on a P+ base layer (not shown). Substrate 102 contains trench oxide 104 that provides dielectric isolation between P– type NMOS region 106 and N– type PMOS region 108 in the epitaxial surface layer. NMOS region 106 has a boron background concentration on the order of $1\times10^{15}$ atoms/cm$^3$, a <100> orientation and a resistivity of 12 ohm-cm. PMOS region 108 has a phosphorous background concentration on the order of $1\times10^{15}$ atoms/cm$^3$, a <100> orientation and a resistivity of 12 ohm-cm. A blanket layer of gate oxide 110, composed of silicon dioxide (SiO$_2$), is formed on the top surface of substrate 102 using tube growth at a temperature of 700 to 1000° C. in an O$_2$ containing ambient. Gate oxide 110 has a thickness in the range of 30 to 100 angstroms. Thereafter, polysilicon layer 112 is deposited by low pressure chemical vapor deposition on the top surface of gate oxide 110. Polysilicon layer 112 has a thickness of 500–2000 angstroms. If desired, polysilicon layer 112 can be doped in situ as deposition occurs, or doped immediately after deposition by implanting arsenic with a dosage in the range of $1\times10^{15}$ to $5\times10^{15}$ atoms/cm$^2$ and an energy in the range of 2 to 10 kiloelectron-volts. However, it is generally preferred that polysilicon layer 112 be initially doped during later processing steps, as described below.

Figure 1B:
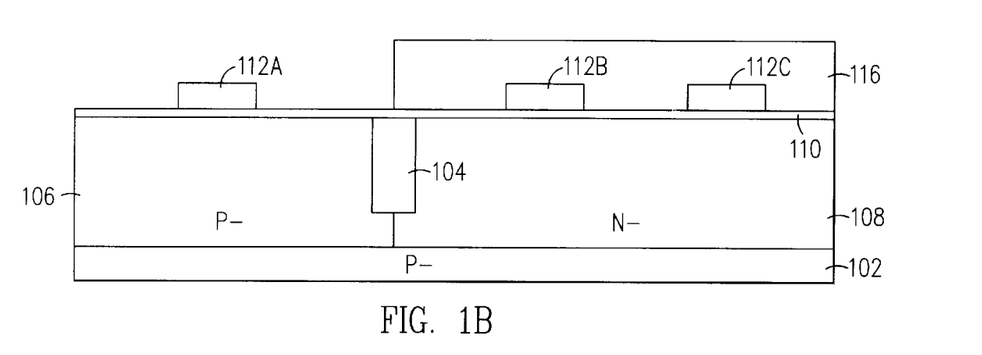

In FIG. 1B, a photoresist layer (not shown) is deposited on polysilicon layer 112. A photolithographic system, such as a step and repeat optical projection system which generates deep ultraviolet light from a mercury-vapor lamp, uses a gate electrode reticle to irradiate the photoresist layer with a gate electrode image pattern. Thereafter, the irradiated portions of the photoresist layer are removed, and an anisotropic dry etch is applied using the remaining photoresist as an etch mask, which etch removes the regions of polysilicon layer 112 beneath the openings in the photoresist layer. The etch is highly selective of polysilicon layer 112 with respect to gate oxide 110, so only a negligible amount of gate oxide 110 is removed and substrate 102 is unaffected. The etch forms polysilicon region 112A of polysilicon layer 112 over NMOS region 106, and polysilicon regions 112B and 112C of polysilicon layer 112 over PMOS region 108. Polysilicon regions 112A, 112B, and 112C each include opposing vertical edges separated by a length of 3500 angstroms. Polysilicon region 112A and polysilicon regions 112B, 112C form gate electrodes for IGFETs to be formed over NMOS region 106 and PMOS region 108, respectively. The earlier photoresist layer is stripped, and photoresist layer 116 is deposited over NMOS region 106 and PMOS region 108. The photolithographic system uses a second reticle to irradiate photoresist layer 116 with a second image pattern. Thereafter, the irradiated portions of photoresist layer 116 are removed, and photoresist layer 116 covers the entire PMOS region 108 and includes an opening above the entire NMOS region 106.

Figure 1C:
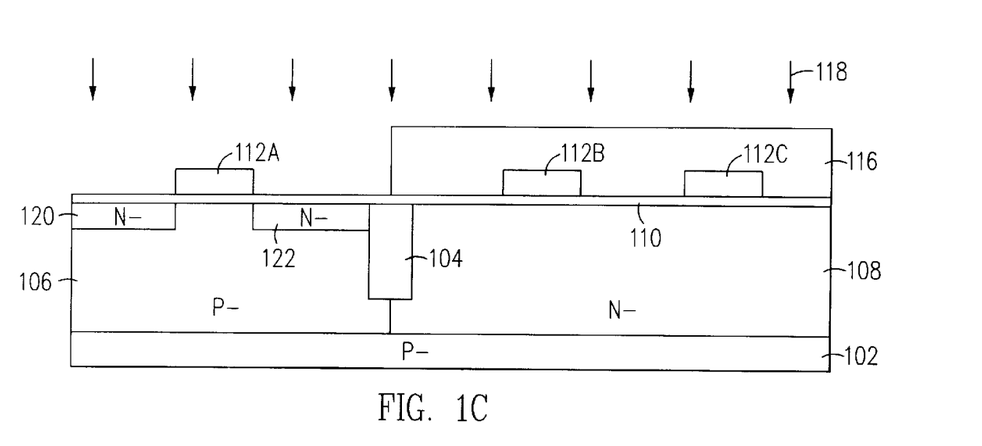

In FIG. 1C, lightly doped source and drain regions are implanted into NMOS region 106 by subjecting the structure to ion implantation of arsenic, indicated by arrows 118, at a dose in the range of $1\times10^{13}$ to $5\times10^{14}$ atoms/cm$^2$ and an energy in the range of 2 to 10 kiloelectron-volts, using polysilicon region 112A and photoresist 116 as an implant mask. As a result, lightly doped source/drain regions 120 and 122 are implanted in NMOS region 106 and are self-aligned to the opposing vertical edges of polysilicon region 112A. Lightly doped source/drain regions 120 and 122 are doped N– with an arsenic concentration in the range of about $1\times10^{17}$ to $1\times10^{18}$ atoms/cm$^3$ and a depth in the range of 100 to 300 angstroms.

Figure 1D:
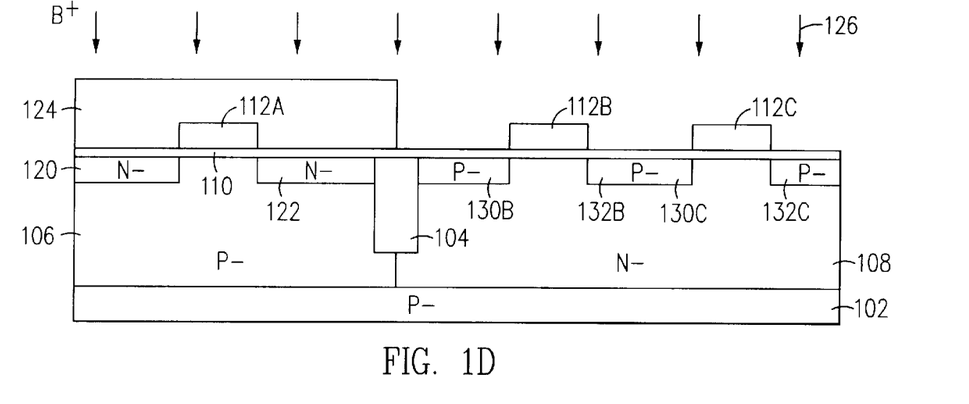

In FIG. 1D, photoresist layer 116 is stripped, and photoresist layer 124 is deposited over NMOS region 106 and PMOS region 108. The photolithographic system uses a third reticle to irradiate photoresist layer 124 with a third image pattern. Thereafter, the irradiated portions of photoresist layer 124 are removed, and photoresist layer 124 covers the entire NMOS region 106 and includes an opening above the entire PMOS region 108. Lightly doped source and drain regions are implanted into PMOS region 108 by subjecting the structure to ion implantation of boron, indicated by arrows 126, at a dose in the range of $1\times10^{13}$ to $5\times10^{14}$ atoms/cm$^2$ and an energy in the range of 2 to 10 kiloelectron-volts using polysilicon regions 112B and 112C and photoresist layer 124 as an implant mask. As a result, lightly doped source/drain regions 130B, 132B, and 130C, 132C are implanted in PMOS region 108 and are self-aligned to the opposing vertical edges of polysilicon regions 112B and 112C, respectively. Lightly doped source/drain regions 130B, 132B, 130C, and 132C are doped P– with a boron concentration in the range of about $1 \times 10^{17}$ to $1 \times 10^{18}$ atoms/cm$^3$ and a depth in the range of 100 to 300 angstroms.

Figure 1E:
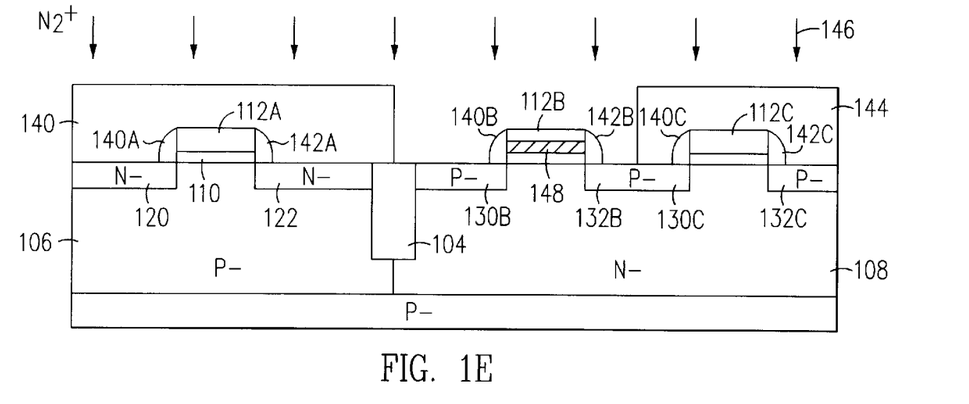

In FIG. 1E, photoresist layer 124 is stripped, a dry etch is applied that removes gate oxide 110 outside the polysilicon gate electrodes, and another oxide layer with a thickness of 2500 angstroms is conformally deposited over the exposed surfaces by plasma enhanced chemical vapor deposition at a temperature in the range of 300 to 450° C. Thereafter, the structure is subjected to an anisotropic reactive ion etch that forms oxide spacers 140A, 142A, spacers 140B, 142B, and spacers 140C, 142C adjacent to the opposing vertical edges of respective polysilicon regions 112A, 112B, and 112C. Spacers 140A, 142A cover portions of lightly doped source/drain regions 120 and 122, and spacers 140B, 142B cover portions of lightly doped source/drain regions 130B, 132B, and spacers 140C, 142C cover portions of lightly doped source/drain regions 130C, 132C. Photoresist layer 144 is deposited over NMOS region 106 and PMOS region 108. The photolithographic system uses a third reticle to irradiate photoresist layer 144 with a fourth image pattern. Thereafter, the irradiated portions of photoresist layer 144 are removed, and photoresist layer 144 covers the entire NMOS region 106 and includes an opening above the gate electrode 112B within the PMOS region 108. A diffusion-retarding material is implanted into gate electrode 112B and into exposed portions of PMOS region 108 by subjecting the structure to ion implantation of N$_2$, indicated by arrows 146, at a dose in the range of $2 \times 10^{14}$ to $2 \times 10^{16}$ atoms/cm$^2$ and an energy in the range of 5 to 30 kiloelectron-volts (keV) using photoresist layer 144 as an implant mask. As a result, nitrogen-doped region 148 is formed within the gate electrode 112B and is doped with a nitrogen concentration in the range of about $1 \times 10^{16}$ to $1 \times 10^{18}$ atoms/cm$^3$ and a depth in the range of approximately 300 angstroms (Å).

Figure 1F:
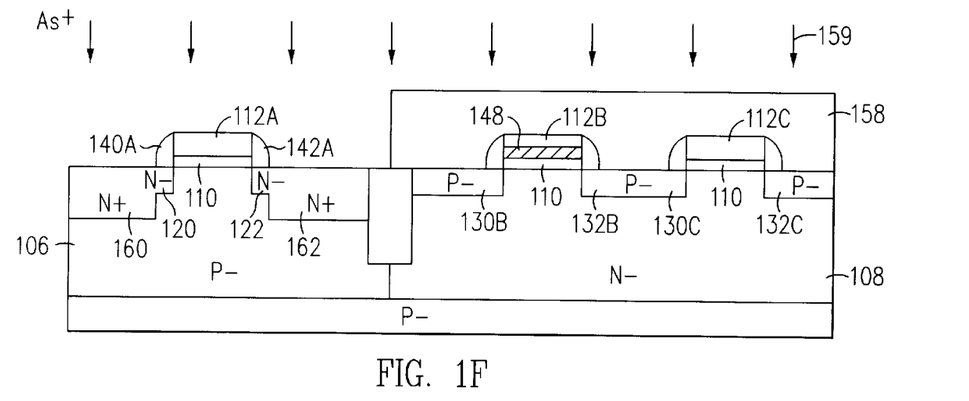

In FIG. 1F, photoresist layer 144 is stripped, and photoresist layer 158 is deposited over NMOS region 106 and PMOS region 108. The photolithographic system uses the second reticle to irradiate photoresist layer 158 with the second image pattern. Thereafter, the irradiated portions of photoresist layer 158 are removed, and photoresist layer 158 covers the entire PMOS region 108 and includes an opening above the entire NMOS region 106. Heavily-doped source and drain regions are implanted into NMOS region 106 by subjecting the structure to ion implantation of arsenic, indicated by arrows 159, at a dose in the range of $1 \times 10^{15}$ to $5 \times 10^{15}$ atoms/cm$^2$ and an energy in the range of 10 to 80 kiloelectron-volts, using polysilicon region 112A and spacers 140A, 142A and photoresist layer 158 as an implant mask. As a result, heavily doped source/drain regions 160 and 162 are implanted in NMOS region 106 and are self-aligned to the outside edges of spacers 140A, 142A. Heavily doped source/drain regions 160 and 162 are doped N+ with an arsenic concentration in the range of about $1 \times 10^{18}$ to $1 \times 10^{20}$ atoms/cm$^3$ and a depth in the range of 300 to 2500 angstroms. Preferably, the depth of heavily doped source/drain regions 160 and 162 exceeds that of lightly doped source/drain regions 120 and 122.

Figure 1G:
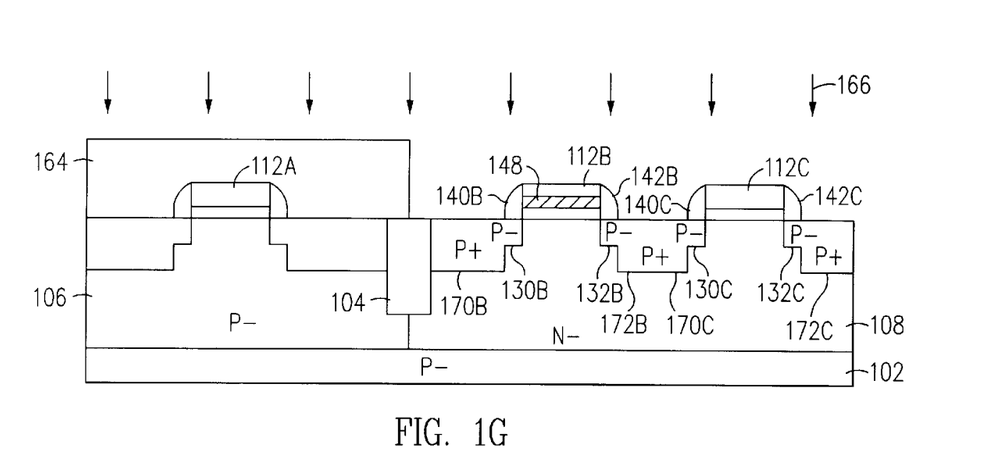

In FIG. 1G, photoresist layer 158 is stripped, and photoresist layer 164 is deposited over NMOS region 106 and PMOS region 108. The photolithographic system uses the third reticle to irradiate photoresist layer 164 with the third image pattern. Thereafter, the irradiated portions of photoresist layer 164 are removed, and photoresist layer 164 covers the entire NMOS region 106 and includes an opening above the entire PMOS region 108. Heavily doped source and drain regions are implanted into the PMOS region 108 by subjecting the structure to ion implantation of boron, indicated by arrows 166, at a dose in the range of $1 \times 10^{15}$ to $5 \times 10^{15}$ atoms/cm$^2$ and an energy in the range of 10 to 80 kiloelectron-volts, using polysilicon regions 112B, 112C and spacers 140B, 142B, 140C, 142C and photoresist layer 164 as an implant mask. As a result, heavily doped source/drain regions 170B, 172B are implanted in PMOS region 108 and are self-aligned to the outside edges of spacers 140B, 142B, and heavily doped source/drain regions 170C, 172C are implanted in PMOS region 108 and are self-aligned to the outside edges of spacers 140C, 142C. Heavily doped source/drain regions 170B, 172B, 170C, and 172C are doped P+ with a boron concentration in the range of about $1 \times 10^{18}$ to $1 \times 10^{20}$ atoms/cm$^3$ and a depth in the range of 300 to 2500 angstroms. Preferably, the depth of heavily doped source/drain regions 170 and 172 exceeds that of lightly doped source/drain regions 130 and 132.

Figure 1H:
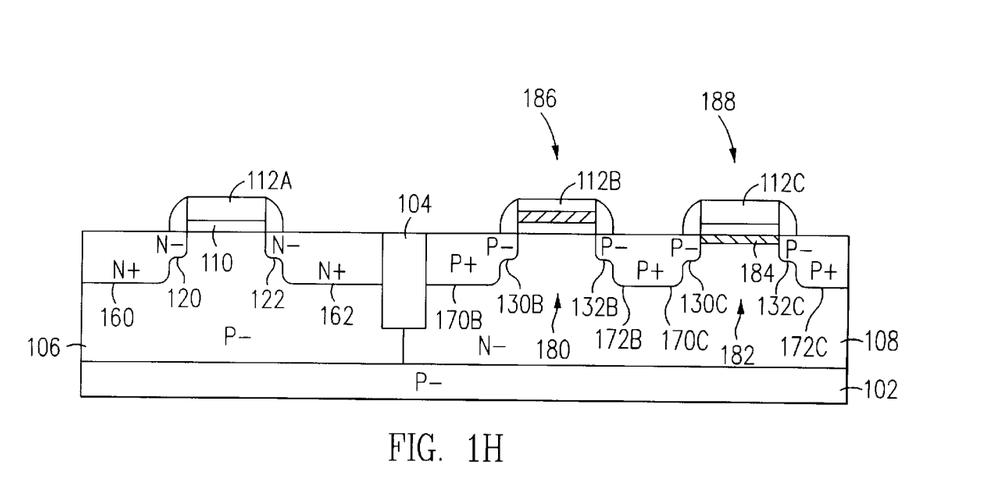

In FIG. 1H, photoresist layer 164 is stripped, and the device is annealed to remove crystalline damage and to drive-in and activate the implanted dopants by applying a rapid thermal anneal on the order of 950 to 1050° C. for 10 to 30 seconds. Source regions 120 and 160 form a source, and drain regions 122 and 162 form a drain for an NMOS device in NMOS region 106. Source regions 130B and 170B form a source, and drain regions 132B and 172B form a drain for a first PMOS device 186 in PMOS region 108. Source regions 130C and 170C form a source, and drain regions 132C and 172C form a drain for a second PMOS device 188 in PMOS region 108. Since the source/drain regions diffuse both vertically and laterally, lightly doped regions 120 and 122 extend slightly beneath polysilicon region 112A, lightly doped regions 130B and 132B extend slightly beneath polysilicon region 112B, lightly doped regions 130C and 132C extend slightly beneath polysilicon region 112C, heavily-doped regions 160, 162 extend partially beneath spacers 140A, 142A, heavily-doped regions 170B, 172B extend partially beneath spacers 140B, 142B, and heavily doped regions 170C, 172C extend partially beneath spacers 140C, 142C.

During this anneal, boron previously implanted into the polysilicon region 112C diffuses downward into and through the gate oxide 110, and forms a dopant layer 184 within the channel region 182. Arsenic in polysilicon region 112A does not diffuse as readily into the NMOS channel region because of the high atomic mass of the arsenic atom. Moreover, because of the nitrogen-doped layer 148 within the polysilicon region 112B, little boron diffuses into the channel region 180 below the polysilicon region 112B. Consequently, the boron concentration near the surface of the channel region 182 is higher than the boron concentration near the surface of the channel region 180. As a result, the P-channel threshold voltage is lower in magnitude (less negative, and more tending to a depletion mode). For example, the threshold voltage of IGFET 186 is from –0.3 to –0.8 volts, and the threshold voltage of IGFET 188 is from –0.1 to –0.25 volts. With sufficiently high concentration within the boron layer 184, the threshold voltage of transistor 188 may become positive (resulting in a depletion-mode device).

Further processing steps in the fabrication of IGFETs typically include forming salicide contacts on the gates, sources and drains, forming a thick oxide layer over the active regions, forming contact windows in the oxide layer to expose the salicide contacts, forming interconnect metallization in the contact windows, and forming a passivation layer over the metallization. In addition, earlier or subsequent high-temperature process steps can be used to supplement or replace the anneal step to provide the desired anneal, activation, and drive-in functions. These further processing steps are conventional and need not be repeated herein. Likewise the principal processing steps disclosed herein may be combined with other steps apparent to those skilled in the art.

An IGFET transistor may be conceptualized as having a control terminal which controls the flow of current between a first current handling terminal and a second current handling terminal. Although IGFET transistors are frequently discussed as having a drain, a gate, and a source, in many such devices the drain is interchangeable with the source. This is because the layout and semiconductor processing of the transistor is frequently symmetrical. For a symmetrical N-channel IGFET transistor, the current handling terminal normally residing at the higher voltage is customarily called the drain. The current handling terminal normally residing at the lower voltage is customarily called the source. A sufficient voltage on the gate (relative to the "source" voltage) causes a current to therefore flow from the drain to the source. The source voltage referred to in N-channel IGFET device equations merely refers to whichever drain or source terminal has the lower voltage at any given point in time. For example, the "source" of the N-channel device of a bi-directional CMOS transfer gate depends on which side of the transfer gate is at the lower voltage. To reflect this symmetry of most N-channel IGFET transistors, the control terminal may be deemed the gate, the first current handling terminal may be termed the "drain/source", and the second current handling terminal may be termed the "source/drain". Alternatively, one current-handling terminal may arbitrarily deemed the "drain" and the other deemed the "source", with an implicit understanding that the two are not distinct, but interchangeable. Such a description is equally valid for a symmetrical P-channel IGFET transistor, since the polarity between drain and source voltages, and the direction of current flow between drain and source, is not necessarily implied by such terminology. It should be noted that IGFET transistors are commonly referred to as MOSFET transistors (which literally is an acronym for "Metal-Oxide-Semiconductor Field Effect Transistor"), even though the gate material may be polysilicon or some material other than metal, and the dielectric may be oxynitride, nitride, or some material other than oxide. The continued use of such widely-used historical legacy terms as MOSFET should not be interpreted to literally specify a metal gate FET having an oxide dielectric.

The present invention includes numerous variations to the embodiments described above. For instance, a dopant may be implanted into the polysilicon layer 112 before etching of the polysilicon layer 112 to form the gate electrodes, and the dopant diffused into the channel region 182 to form the dopant layer 184, even if the lightly-doped source/drain regions 130C, 132C (as well as the heavily-doped source/drain regions 170C, 172C) are not yet formed. The nitrogen implant 146 may also be performed into a sheet of polysilicon before definition of the gate electrodes. As another example, the diffusion of boron into the channel region 182 may be performed independently of the annealing of the source/drain regions. Still further, a diffused dopant layer may be formed within the channel region 180 having a different dopant concentration than that formed within the channel region 182, and still provide a differential threshold voltage between the transistors of the IGFET pair.

Other diffusion-retarding materials may be introduced into the polysilicon layer portion forming the gate electrode 112B, such as elemental nitrogen (N), molecular nitrogen ($N_2$), $NO_3$, as well as other nitrogen-containing compounds.

The gate insulator and spacers can be various dielectrics such as silicon dioxide, silicon nitride and silicon oxynitride. The active regions can be isolated using various techniques such as LOCOS oxidation. Suitable N-type dopants include arsenic and phosphorus; suitable P-type dopants include boron $B_{10}$, boron $B_{11}$, and $BF_X$ species such as $BF_2$.

The invention is particularly well-suited for fabricating P-channel IGFETs having one of two different threshold voltages, particularly for high-performance microprocessors where high circuit density is essential. Although a single N-channel and a pair of P-channel devices has been shown for purposes of illustration, it is understood that in actual practice, many devices are fabricated on a single semiconductor wafer as widely practiced in the art. Accordingly, the invention is well-suited for use in an integrated circuit chip, as well as an electronic system including a microprocessor, a memory and a system bus.

Those skilled in the art will readily implement the steps necessary to provide the structures and methods disclosed herein, and will understand that the process parameters, materials, and dimensions are given by way of example only and can be varied to achieve the desired structure as well as modifications which are within the scope of the invention. Variations and modifications of the embodiments disclosed herein may be made based on the description set forth herein, without departing from the scope and spirit of the invention as set forth in the following claims.

What is claimed is:

1. A method of establishing a differential threshold voltage during the fabrication of first and second IGFETs having like conductivity type, said first IGFET having a first gate electrode formed from a first portion of a gate electrode layer and having a first channel region disposed below the first gate electrode and further disposed between a first source and a first drain, said second IGFET having a second gate electrode formed from a second portion of the gate electrode layer and having a second channel region disposed below the second gate electrode and further disposed between a second source and a second drain, said method comprising the steps of:

providing a semiconductor substrate with first and second channel regions disposed within respective first and second active regions of like conductivity type, and first and second portions of a gate electrode layer respectively formed over the first and second channel regions;

introducing a dopant into the first and second portions of the gate electrode layer;

diffusing a first amount of the dopant from the first portion of the gate electrode layer into the first channel region;

diffusing a second amount of dopant from the second portion of the gate electrode layer into the second channel region; and removing portions of the gate electrode layer other than the first and second portions to form respective first and second gate electrodes for the respective first and second IGFETs;

wherein the first amount differs from the second amount, thereby establishing a differential dopant concentration between the first and second channel regions to provide a differential threshold voltage between the first and second IGFETs.

2. A method as in claim 1 wherein the respective first and second amounts of dopant are diffused into the respective first and second channel regions during a single operation.

3. A method as in claim 1 wherein the respective gate electrodes are formed before introducing the dopant.

4. A method as in claim 1 wherein the respective gate electrodes are formed after introducing the dopant into the respective portions of the gate electrode layer.

5. A method as in claim 1 wherein the respective first and second amounts of dopant are diffused into the respective first and second channel regions before forming the respective first and second gate electrodes.

6. A method as in claim 1 wherein the respective first and second amounts of dopant are diffused into the respective first and second channel regions after forming the respective first and second gate electrodes.

7. A method as in claim 1 including:
introducing a diffusion-retarding material into the first portion of the gate electrode layer over the first channel region before the first amount of dopant is diffused into the first channel region, and without introducing a significant amount of the diffusion-retarding material into the second portion of the gate electrode layer over the second channel region.

8. A method as in claim 1 including:
introducing a diffusion-retarding material into the first portion of the gate electrode layer over the first channel region before the dopant is introduced thereinto, and without introducing a significant amount of the diffusion-retarding material into the second portion of the gate electrode layer over the second channel region.

9. A method as in claim 7 wherein the diffusion-retarding material contains nitrogen.

10. A method as in claim 1 wherein the first amount is negligible compared to the second amount.

11. A method as in claim 10 wherein the first amount is substantially zero.

12. An integrated circuit chip, including an IGFET fabricated in accordance with the method of claim 1.

13. An electronic system including a microprocessor, a memory and a system bus, and further including an IGFET fabricated in accordance with the method of claim 1.

14. A method of making first and second IGFETs having like conductivity type and differential threshold voltages, comprising the steps of:
providing a semiconductor substrate with first and second channel regions disposed within respective first and second active regions of like conductivity type;
forming a gate insulator on the first and second channel regions;
forming a first gate electrode on the gate insulator over the first channel region and a second gate electrode on the gate insulator over the second channel region;
introducing a dopant into the first and second gate electrodes;
differentially diffusing dopant from the first and second gate electrode into the respective first and second channel regions, thereby establishing a differential dopant concentration between the first and second channel regions; and
forming a source and drain for the first IGFET in the first active region and a source and drain for the second IGFET in the second active region;
wherein said differential dopant concentration provides a differential threshold voltage between the first and second IGFETs.

15. A method as in claim 14 wherein the differential diffusing step comprises:
introducing a dopant diffusion-retarding material into the first gate electrode without introducing a significant amount of the material into the second gate electrode; then
exposing the first and second gate electrodes to an environment sufficient to cause dopant diffusion from the second gate electrode into the second channel region;
wherein the dopant diffusion-retarding material introduced into the first gate electrode results in a lesser amount of dopant diffusion from the first gate electrode into the first channel region than from the second gate electrode into the second channel region.

16. A method as in claim 14 wherein the first and second active regions are disposed within a single active area.

17. A method as in claim 14 wherein the first and second active regions are disposed within different active areas.

18. A method as in claim 14 including:
introducing a dopant diffusion-retarding material into the first gate electrode without introducing a significant amount of the material into the second gate electrode, before the differential diffusing step.

19. A method as in claim 14 including:
forming spacers on the first and second gate electrodes before introducing the dopant respectively thereinto.

20. A method as in claim 14 wherein:
the respective source and drain for the first and second IGFETs are formed by annealing a source/drain dopant previously-implanted into the respective active regions; and
the dopant from the respective first and second gate electrodes are differentially diffused into the respective first and second channel regions during the source/drain anneal.

21. A method as in claim 14 wherein:
the respective source and drain for the first and second IGFETs are formed by annealing a source/drain dopant previously-implanted into the respective active regions; and
the dopant from the respective first and second gate electrodes are differentially diffused into the respective first and second channel regions independent of the source/drain anneal.

22. A method as in claim 20 wherein:
the source/drain dopant is identical to the dopant introduced into the first and second gate electrodes; and
the source/drain dopant is introduced into the respective active regions when introducing the dopant into the first and second gate electrodes.

23. A method of making first and second IGFETs having like conductivity type and having different first and second threshold voltages, comprising the steps of:
providing a semiconductor substrate with first and second channel regions disposed within respective first and second active regions of like conductivity type;
forming a gate insulator on the first and second channel regions;
forming a polysilicon layer on the gate insulator;
etching the polysilicon layer to form a first gate electrode on the gate insulator over the first channel region and a second gate electrode on the gate insulator over the second channel region;
introducing a nitrogen-containing material into the first gate electrode without introducing a significant amount of the material into the second gate electrode;

introducing a dopant into the first and second gate electrodes and into exposed portions of the respective first and second active regions;

annealing to form a source and drain for the first IGFET in the first active region and a source and drain for the second IGFET in the second active region, and to diffuse a first amount of dopant from the first gate electrode into the first channel region therebelow and a second amount of dopant from the second gate electrode into the second channel region therebelow;

said nitrogen-containing material within the first gate electrode for retarding the diffusion of the dopant from the first gate electrode into the first channel region therebelow, thereby resulting in the first amount being less than the second amount;

wherein said first amount of dopant within the first channel region provides for a first threshold voltage of the first IGFET, and the second amount of dopant within the second channel region provides for a second threshold voltage of the second IGFET which is different from the first threshold voltage.

24. The method of claim 23 including implanting into exposed portions of the first and second active regions after forming the first and second gate electrodes, to form lightly-doped source/drain regions for the respective first and second IGFETs.

25. The method of claim 24 including forming spacers on the first and second gate electrodes before introducing the dopant into the exposed portions of the first and second active regions.

26. The method of claim 23 wherein the dopant is chosen from the group consisting of boron $B_{10}$, boron $B_{11}$, and $BF_2$.

27. The method of claim 23 wherein the nitrogen-containing material is chosen from the group consisting of N, $N_2$, NO, and $NO_3$.

28. The method of claim 23 wherein the nitrogen-containing material is introduced by implanting $N_2$ at a dose in the range of $2 \times 10^{14} - 2 \times 10^{16}$ atoms/cm$^2$ and at an energy in the range of 5–30 keV.

29. The method of claim 23 wherein the first and second gate electrodes are between 500–2000 Å thick.

30. The method of claim 23 wherein the first and second threshold voltages are both enhancement mode threshold voltages.

31. The method of claim 23 wherein the first and second threshold voltages comprise an enhancement mode/depletion mode pair of threshold voltages.

* * * * *